United States Patent
Kopacz et al.

(10) Patent No.: US 6,368,987 B1
(45) Date of Patent: Apr. 9, 2002

(54) APPARATUS AND METHOD FOR PREVENTING THE PREMATURE MIXTURE OF REACTANT GASES IN CVD AND PECVD REACTIONS

(75) Inventors: Stanislaw Kopacz; Douglas Arthur Webb, both of Phoenix; Gerrit Jan Leusink, Tempe, all of AZ (US); Rene Emile LeBlanc, East Haven, CT (US); Michael S. Ameen, Phoenix, AZ (US); Joseph Todd Hillman, Scottsdale, AZ (US); Robert F. Foster, Mesa, AZ (US); Robert Clark Rowan, Jr., Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/587,916

(22) Filed: Jun. 6, 2000

Related U.S. Application Data

(62) Division of application No. 08/940,779, filed on Sep. 30, 1997, now Pat. No. 6,161,500.

(51) Int. Cl.[7] .............................................. H01L 21/31
(52) U.S. Cl. .................. 438/788; 118/723 E; 118/725; 118/724; 118/723 I; 438/795
(58) Field of Search ............................. 118/715, 723 E; 427/248.1, 534, 538, 570; 438/710, 158, 485, 631, 696, 788; 204/192.12, 192.15, 192.26, 192.3, 192.32, 298.11, 298.33; 219/121.43

(56) References Cited

U.S. PATENT DOCUMENTS

| | | | |
|---|---|---|---|
| 4,209,357 A | * 6/1980 | Gorin et al. | 438/710 |
| 4,534,816 A | * 8/1985 | Chen et al. | 156/345 |
| 4,728,528 A | 3/1988 | Ishihara et al. | 427/568 |
| 4,759,947 A | 7/1988 | Ishihara et al. | 427/568 |
| 4,778,692 A | 10/1988 | Ishihara et al. | 427/568 |

(List continued on next page.)

FOREIGN PATENT DOCUMENTS

| | | |
|---|---|---|
| EP | 0254654 | 1/1988 |
| GB | 2181458 | 4/1987 |
| JP | 2-234419 | 9/1960 |
| JP | 53-91664 | 11/1978 |
| JP | 60-98629 | 6/1985 |

(List continued on next page.)

OTHER PUBLICATIONS

Remery, K.P. et al., Numerical Simulations of the MRC Single–Wafer (PE)CVD Reaction for Ti and TiN Deposition: Phase 2: Parametric Study of the New Reactor Geometry with Multi–Point Injection, Kramers Laboratorium voor Fysische Technologie, Aug. 22, 1996, no page numbers.

Schackelford, J.F., Introduction to Materials Science for Engineers, 3rd Ed., MacMillian, 1992.

Primary Examiner—Gregory Mills
Assistant Examiner—Rudy Zervigon
(74) Attorney, Agent, or Firm—Wood, Herron & Evans, LLP

(57) ABSTRACT

A method and apparatus for depositing a film by chemical vapor deposition comprises a showerhead for dispersing reactant gases into the processing space wherein the showerhead has a first space therein operable for receiving and dispersing the first reacting gas, and has a second space therein, generally isolated from the first space, and operable for receiving and dispersing the second reactant gas separate from the first gas dispersion for maintaining segregation of reactant gases and generally preventing premature mixture of the gases prior to their introduction into the processing space to prevent premature deposition in the system.

11 Claims, 9 Drawing Sheets

U.S. PATENT DOCUMENTS

| | | | |
|---|---|---|---|
| 4,784,874 A | 11/1988 | Ishihara et al. | 427/568 |
| 4,792,378 A | 12/1988 | Rose et al. | 438/706 |
| 4,798,165 A | 1/1989 | deBoer et al. | 118/715 |
| 4,801,468 A | 1/1989 | Ishihara et al. | 427/563 |
| 4,818,563 A | 4/1989 | Ishihara et al. | 427/568 |
| 4,853,251 A | 8/1989 | Ishihara et al. | 427/563 |
| 4,897,709 A | 1/1990 | Yokoyama et al. | 257/301 |
| 4,898,118 A | 2/1990 | Murakami et al. | 118/723 ME |
| 4,908,329 A | 3/1990 | Kanai et al. | 427/575 |
| 4,908,330 A | 3/1990 | Arai et al. | 438/5 |
| 4,979,465 A | 12/1990 | Yoshino et al. | 118/719 |
| 4,987,856 A | 1/1991 | Hey et al. | 118/723 E |
| 4,998,503 A | 3/1991 | Murakami et al. | 118/723 ME |
| 5,010,842 A | 4/1991 | Oda et al. | 118/723 ME |
| 5,018,479 A | 5/1991 | Markunas et al. | 118/723 FR |
| 5,052,339 A | 10/1991 | Vakerlis et al. | 118/723 E |
| 5,061,511 A | 10/1991 | Saitoh et al. | 427/575 |
| 5,173,327 A | 12/1992 | Sandhu et al. | 438/680 |
| 5,178,905 A | 1/1993 | Kanai et al. | 427/570 |
| 5,180,435 A | 1/1993 | Markunas et al. | 118/723 IR |
| 5,268,034 A | 12/1993 | Vukelic | 118/719 |
| 5,273,588 A | 12/1993 | Foster et al. | 118/723 E |
| 5,342,471 A | 8/1994 | Fukasawa et al. | 156/345 |
| 5,356,476 A | 10/1994 | Foster et al. | 118/725 |
| 5,370,739 A | 12/1994 | Foster et al. | 118/725 |
| 5,433,787 A | 7/1995 | Suzuki et al. | 118/723 MP |
| 5,434,110 A | 7/1995 | Foster et al. | 438/674 |
| 5,453,124 A * | 9/1995 | Moslehi et al. | 118/715 |
| 5,480,678 A * | 1/1996 | Rudolph et al. | 427/248.1 |
| 5,595,606 A * | 1/1997 | Fujikawa et al. | 118/725 |
| 6,161,500 A * | 12/2000 | Kopacz et al. | 118/723 E |

FOREIGN PATENT DOCUMENTS

| | | | |
|---|---|---|---|
| JP | 60-116126 | 6/1985 | |
| JP | 61-41763 | 2/1986 | |
| JP | 63-187619 | 8/1988 | |
| JP | 5-152208 | 6/1993 | H01L/21/205 |
| JP | 93-310055 | 10/1993 | |
| JP | 6-275530 | 1/1997 | H01L/21/205 |
| WO | WO 93/257322 | 2/1994 | |

* cited by examiner

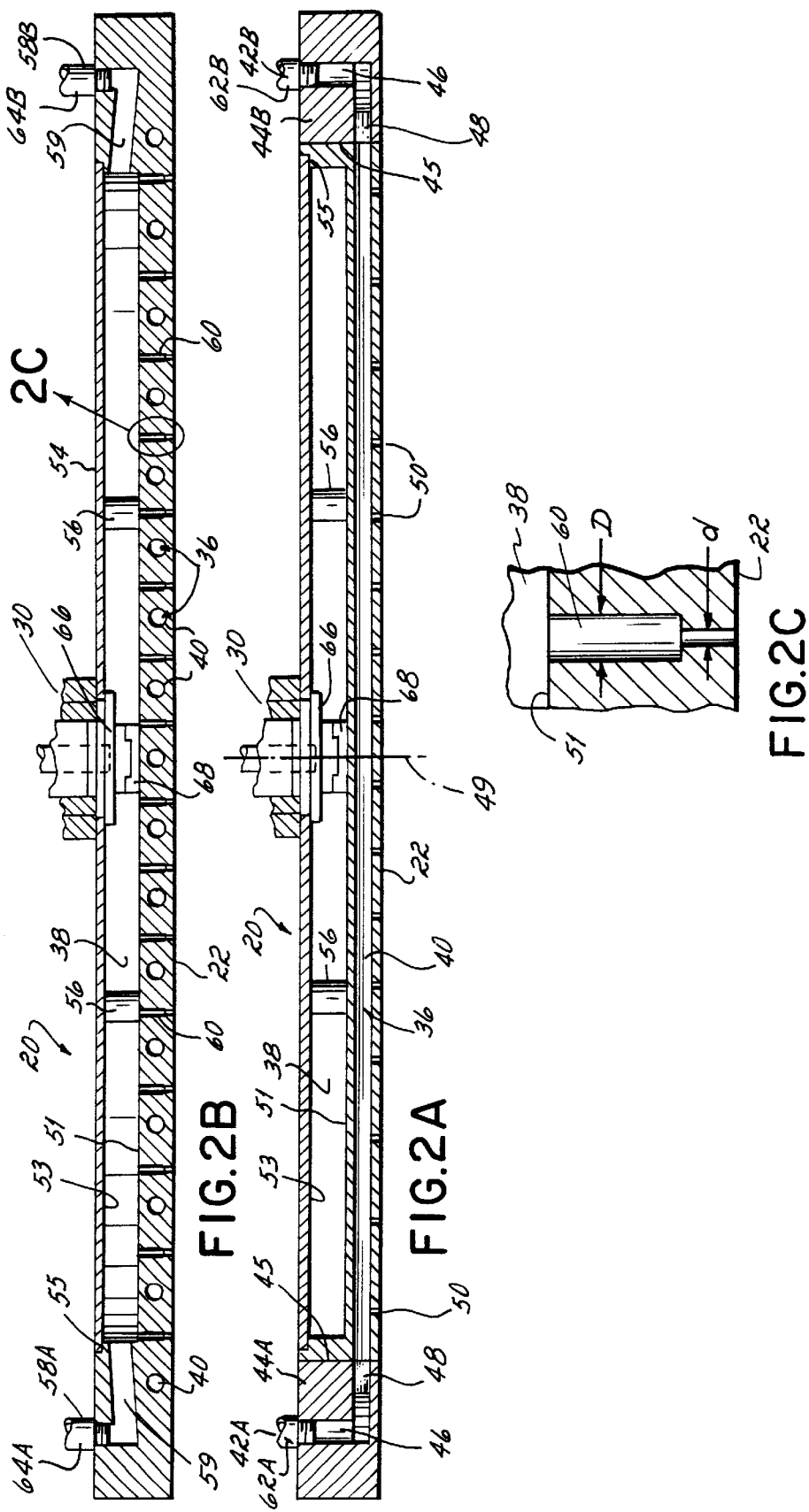

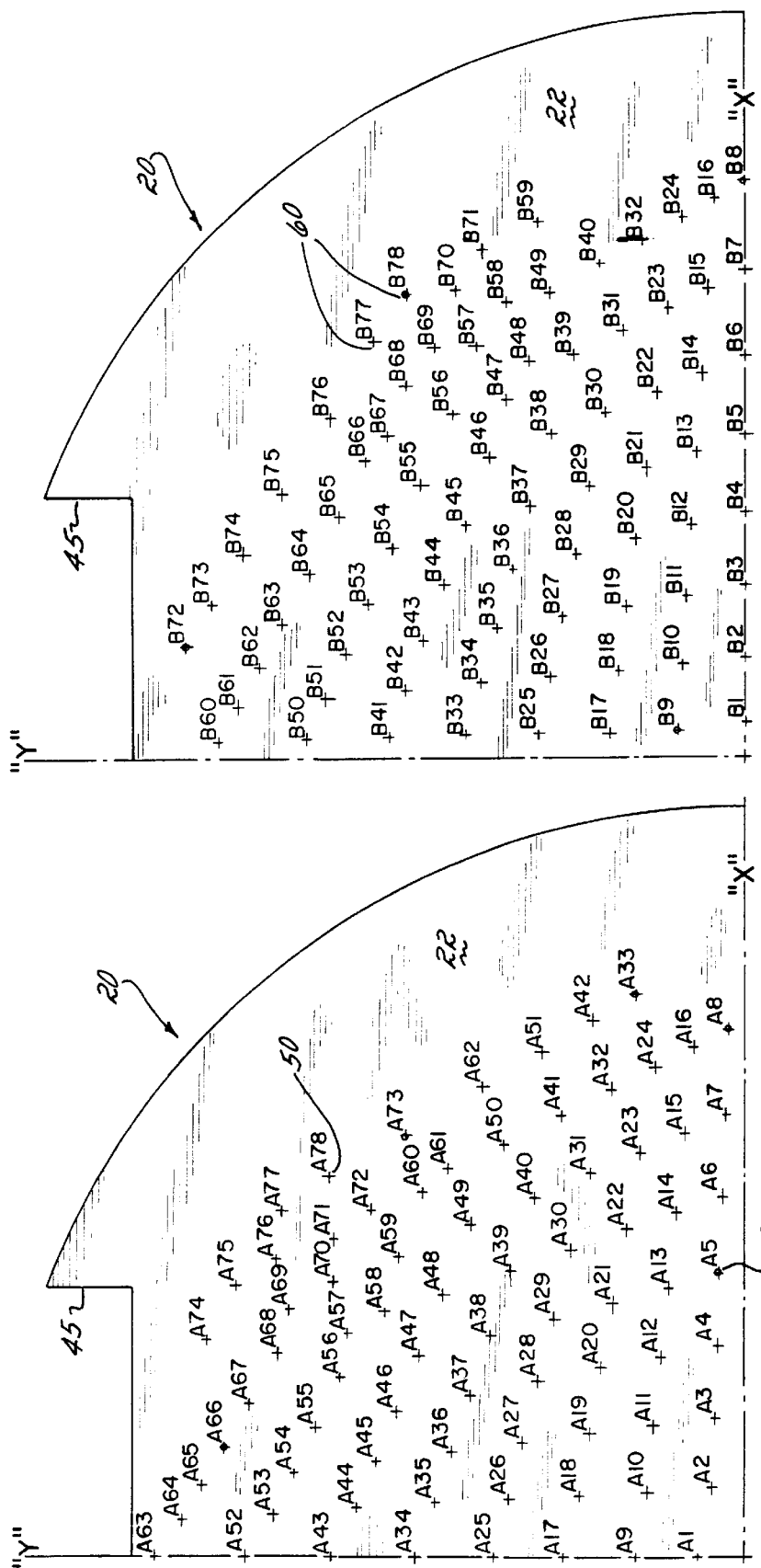

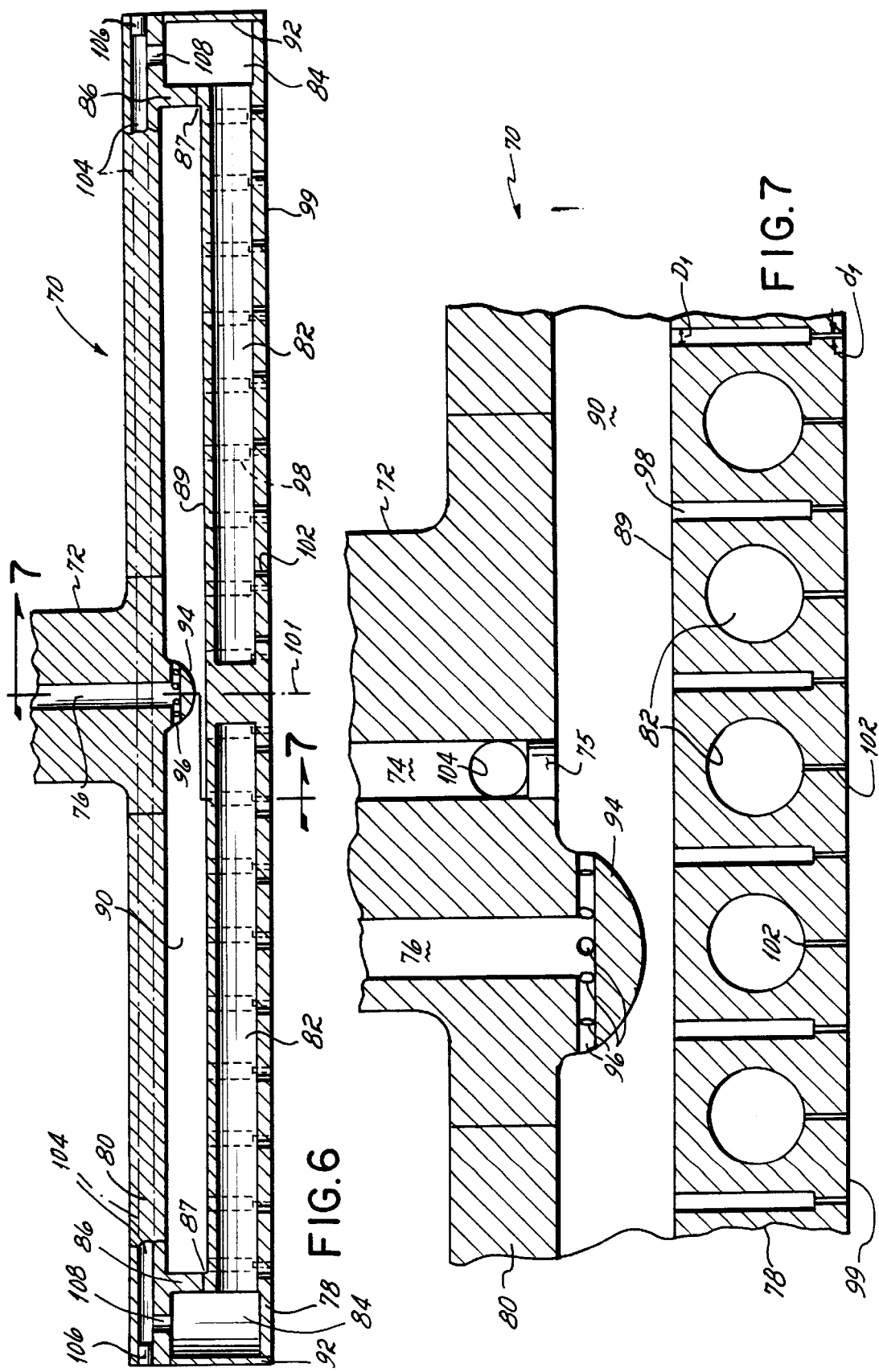

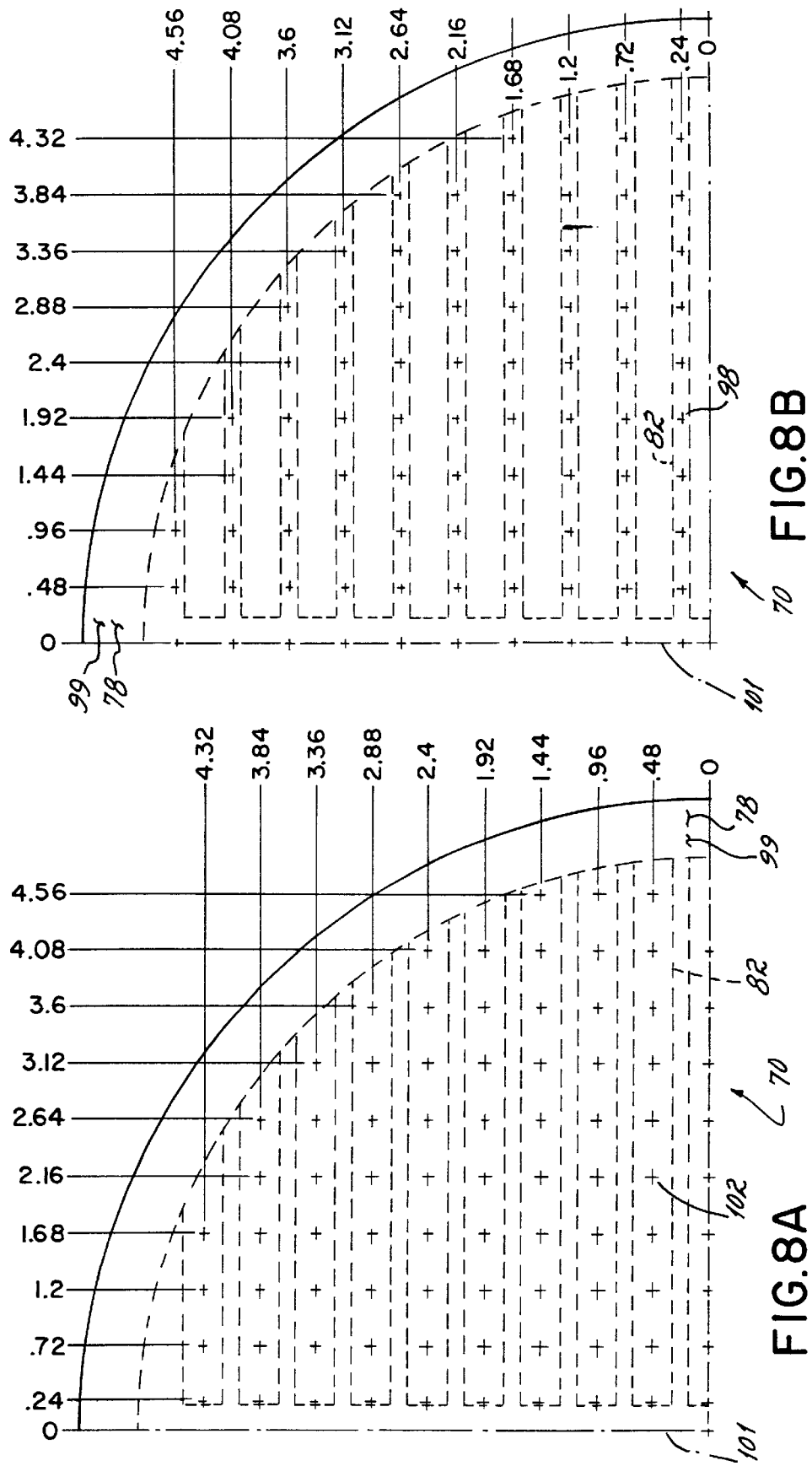

APPARATUS AND METHOD FOR PREVENTING THE PREMATURE MIXTURE OF REACTANT GASES IN CVD AND PECVD REACTIONS

RELATED APPLICATIONS

This application is a divisional of patent application Ser. No. 08/940,779, filed Sep. 30, 1997, now U.S. Pat. No. 6,161,500 entitled "Apparatus and Method for Preventing the Premature Mixture of Reactant Gases in CVD and PECVD Reactions." The parent application is hereby incorporated herein by reference in its entirety.

FIELD OF THE INVENTION

This invention relates generally to chemical vapor deposition (CVD) and plasma-enhanced chemical vapor deposition (PECVD), and more specifically to an apparatus and method for preventing the premature mixture of reactant gas constituents in CVD and PECVD reactions before such mixture is desired in the reaction chamber.

BACKGROUND OF THE INVENTION

In the formation of integrated circuits (IC's), it is often necessary to deposit thin films or layers, such as films containing metal and metalloid elements, upon the surface of a substrate, such as a semiconductor wafer. One purpose of such thin films is to provide conductive and ohmic contacts in the circuits and to yield conductive or barrier layers between the various devices of an IC. For example, a desired film might be applied to the exposed surface of a contact or via hole on an insulating layer of a substrate, with the film passing through the insulating layer to provide plugs of conductive material for the purpose of making interconnections across the insulating layer.

One well known process for depositing such films is chemical vapor deposition (CVD) in which a film is deposited using chemical reactions between various constituent or reactant gases. In CVD, reactant gases are pumped into the processing space of a reaction chamber containing a substrate. The gases react in the processing space proximate the substrate, resulting in one or more reaction by-products. The reaction by-products then deposit onto the substrate to form a film on the exposed substrate surface.

Another variation of the CVD process which is widely utilized is a plasma-enhanced CVD process or PECVD process in which one or more of the reactant gases is ionized into a gas plasma to provide energy to the reaction process. PECVD is desirable for lowering the temperatures that are usually necessary for a proper reaction with standard CVD. In PECVD, electrical energy is delivered to the gas or gases to form and sustain the plasma. For one such PECVD process, the susceptor containing the substrate and a planar element in the processing space, such as a gas supply element, are electrically biased to operate as RF electrodes for energizing one or more of the reactant gases into an ionized plasma. Such a method is commonly referred to as a parallel plate method because the susceptor and the other biased planar element are maintained generally parallel to one another to simulate biased electrical plates with the substrate positioned therebetween and parallel to the biased elements.

The reactant gases for CVD and PECVD processes are delivered to the processing space and substrate through a gas delivery system which provides the proper flow and distribution of the gases for the CVD process. Generally, such gas delivery systems contain gas-dispersing elements in the reaction chamber, such as gas injector rings or flat showerheads, which spread the entering reactant gases around the processing space to insure a uniform distribution and flow of the gases proximate the substrate. Uniform gas distribution and flow is desirable for a uniform and efficient deposition process, a dense plasma, and a uniformly deposited film. Since the gases utilized in CVD and PECVD processes are reactive, it is often necessary to use a separate dispersing element for each constituent gas in order to keep the gases segregated or unmixed prior to the processing space. Otherwise, if the gases mix prior to the processing space, premature deposition occurs inside the dispersing element and inside other sections of the gas delivery system, which hinders a uniform flow of the gas, degrades the deposition process and may contaminate the deposited film.

To maintain separate constituent gases, multiple, concentric gas injector rings have been utilized to prevent premature mixture and deposition prior to the processing space. However, multiple gas injector rings in the processing space make it difficult to utilize PECVD techniques because the rings interfere with the placement and action of the RF electrodes necessary for such PECVD techniques. Therefore, the rings detrimentally affect plasma generation.

Conventional RF PECVD processes generally utilize a biased, planar gas showerhead opposite a parallel, biased susceptor. One such PECVD process and apparatus is disclosed in U.S. Pat. No. 5,547,243, which is commonly owned with the present application. While such a technique produces suitable PECVD films, directing and dispersing all of the reactant gas constituents through available showerheads will produce premature mixing of the gases before the processing space and yield undesirable deposition inside of the showerhead, or in-line in the system before the showerhead. Therefore, for parallel plate PECVD, it has been necessary to disperse some gases through inlet ports other than the showerhead, yielding non-uniform flow of some of the gas constituents at the substrate, or interfering with plasma generation.

Accordingly, it is an objective of the present invention to reduce and generally prevent the premature mixture of reactant gases in CVD and PECVD reactions.

It is still another objective of the invention to prevent the deposition of film material in the gas delivery system and to provide a uniform flow and distribution of reactant gases to the processing space for the deposition process.

It is another objective of the invention to maintain the separation of the reactant gases and generally prevent their interaction until they are injected and mixed proximate the substrate.

It is a further objective generally to prevent such premature interaction and deposition in a PECVD process utilizing parallel plate electrodes without interfering with the RF plasma generation.

Accordingly, the present invention addresses these objectives and the shortcomings of the various CVD and PECVD apparatuses and processes currently available in the prior art.

SUMMARY OF THE INVENTION

The present invention prevents premature mixture of reactant gases in CVD and PECVD reactions and maintains a separation of reactant gases to prevent their interaction until they are injected and mixed in the processing space proximate a substrate. The present invention further provides a uniform flow and distribution of the reactant gases and is suitable for use with RF plasmas and PECVD processes without interfering with the plasma. Particularly, the present invention provides the necessary gas separation while being suitable for parallel plate PECVD processes.

The present invention comprises a generally circular, planar gas-dispersing manifold, preferably in the form of a planar showerhead, which is coupled to at least two different reactant gas lines for dispersing reactant gases into a chamber proximate a substrate. The showerhead has a first space therein which is operable for receiving and dispersing a first reactant gas, and further comprises a second space, which is isolated from the first space, and is also operable for receiving and dispersing a second gas independently of the dispersion of the first gas. The showerhead of the invention maintains a segregation between the reactant gases in the first and second spaces, and prevents a premature mixture of the gases before the gases enter the processing space. In that way, premature deposition in the gas delivery system and prior to the processing space is generally prevented.

To disperse the reactant gases passing through the inventive showerhead, the showerhead includes two separate pluralities of gas-dispersing passages, which are in communication with each of the respective gas spaces within the showerhead, but are isolated from each other. The dispersing passages have outlets which open at a face surface of the showerhead opposite the substrate. When the separate reactant gases are directed through the showerhead, no mixture occurs within the showerhead, and each of the reactant gases is dispersed independently to thus mix proximate the substrate, as desired. The gas-dispersing passages for each of the respective first and second spaces are positioned in cooperating grids around the lower face surface of the showerhead to uniformly disperse and mix the gases proximate the substrate.

In accordance with another aspect of the present invention, the showerhead has a generally planar, and thus compact, design which functions electrically as a parallel plate when biased with RF energy. Therefore, the inventive showerhead may be utilized for parallel plate PECVD processes without interfering with the plasma. As such, the reactant gases are dispersed separately and uniformly for a stable, uniform plasma and a uniform deposition of the film.

The showerhead of the invention has a planar first space positioned in a plane generally parallel with a planar second space and below the second space. That is, the second space is stacked above the first space in the showerhead. Gas is introduced into each of the respective spaces through ports that communicate with the spaces, and the reactant gases spread through the planar spaces to be uniformly dispersed proximate the substrate by the grids of dispersing passages.

In one embodiment of the invention, the first gas space comprises a plurality of elongated cylindrical passages which extend through the showerhead. The passages originate at one area on the periphery of the circular showerhead and extend to another peripheral area on an opposite side of the showerhead. The elongated passages are generally isolated from each other along their lengths, but are co-planar and extend next to each other to define the planar first space. The opposite ends of the elongated first space passages are each coupled to a peripheral coupler which has a single inlet port and a wide outlet port for simultaneously interfacing with each of the ends of the elongated passages. The two couplers provide gas simultaneously to each of the ends of the elongated passages so that gas introduced at the periphery of the circular showerhead is distributed uniformly in the first space and around the showerhead. The elongated passages generally angle out from each coupler to reach a maximum area of the showerhead face surface and then angle back to the opposite coupler.

The second space is an open cylindrical space above the first space elongated passages. A second reactant gas is introduced into the second space through two inlet ports positioned at opposite peripheral points on the showerhead. The ports for introducing the second gas are positioned at approximately a 90° offset on the showerhead periphery from the peripheral first gas couplers so as not to interfere with the couplers for the first space.

One set of gas dispersing passages is arranged in a grid on the showerhead and communicates between the second gas space and the face of the showerhead so that the second gas may be delivered to the processing space. Each passage from the set extends from the second space, past the elongated first space passages, and opens at the showerhead face without intersecting the first space passages. In that way, the gases are kept segregated in the showerhead. Another set of dispersing passages, also in a grid arrangement, communicates with the elongated passages of the first space to deliver the gas therefrom.

In another embodiment of the present invention, the reactant gases are introduced into the center of the showerhead rather than at the periphery thereof. To that end, the showerhead includes a center stem having two passages and two inlet ports for the respective first and second gases. The center stem extends generally perpendicular to the plane of the showerhead and one of the gas inlet ports opens directly into the second space. Preferably a 90° coupler is used to direct the incoming second gas parallel to the plane of the second space. The center stem may be biased with RF energy when desired for PECVD processing.

The first gas port communicates with a diametrical passage, located above the first and second spaces in the showerhead, which directs the gas out to the periphery of the showerhead. The first gas space comprises a peripheral channel which distributes the first gas around the periphery of the showerhead. Gas distribution fingers, each opened at one end thereof, are coupled to the channel and extend toward a diameter line of the showerhead to terminate proximate the diameter line. The fingers are co-planar and are generally parallel to one another, with one set of fingers distributing gas to one half of the showerhead and another set of fingers distributing gas to the other half of the circular showerhead.

Sets of gas dispersing passages are arranged in interacting grids, similar to the embodiment previously described, and the dispersing passages communicate between the respective first and second gas spaces and the showerhead face. The second space passages extend between the fingers of the first space so as not to mix the reactant gases prior to their dispersion at the face of the showerhead and proximate the substrate.

The invention thus provides a segregated, and uniform distribution of the reactant gases while reducing deposition of film material prior to entry of the reactant gases into the processing space containing the substrate. In that way, an efficient gas flow is achieved, premature deposition is prevented, and the likelihood of contamination from deposition within the showerhead is reduced. Furthermore, gas segregation may be maintained during RF PECVD process.

BRIEF DESCRIPTION OF THE DRAWINGS

The accompanying drawings, which are incorporated in and constitute a part of this specification, illustrate embodiments of the invention and, together with a general descrip

FIG. 2A is a cross-sectional view of an embodiment of the invention taken along lines 2A—2A of FIG. 2.

FIG. 2B is a cross-sectional view of an embodiment of the invention taken along lines 2B—2B of FIG. 2.

FIG. 2C is a partial cross-sectional view taken along lines 2C—2C of FIG. 2B.

FIGS. 4A and 4B are bottom sectional views of an embodiment of the invention illustrating the gas-dispersing outlets for the various reactant gases dispersed through the invention.

FIG. 6 is a cross sectional view along lines 6—6 of FIG. 5.

FIG. 7 is a cross sectional view along lines 7—7 of FIG. 6.

FIG. 8A is a top plan view of one quadrant of the showerhead illustrating gas-dispersing openings.

FIG. 8B is a top plan view of one quadrant of the showerhead illustrating gas-dispersing openings.

DETAILED DESCRIPTION OF THE EMBODIMENTS

Figure 1:
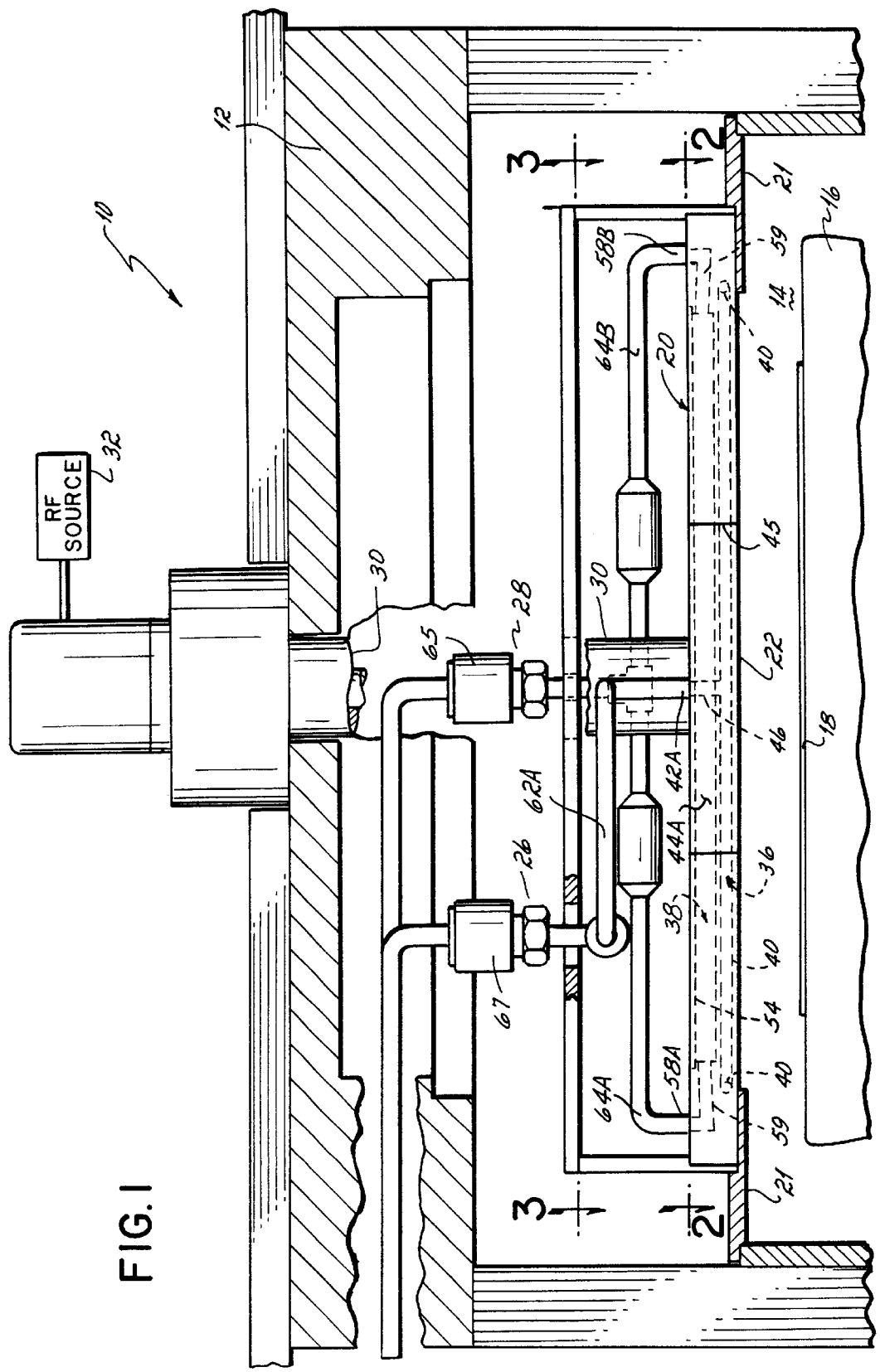
- FIG. 1 is a cross-sectional view of the reaction chamber equipped with the manifold of the present invention.

FIG. 1 is a cross sectional view of the reaction chamber equipped with the gas segregating or "no-mix" gas manifold or showerhead of the present invention. Reaction chamber 10 includes a housing 12 formed of a suitable material such as stainless steel, which defines a processing space 14 therein. A susceptor 16, which may be rotating or stationary, supports a substrate 18 within the processing space 14 to receive a material layer or film through CVD and/or PECVD processes. Reaction chamber 10 will further comprise other systems, such as a vacuum system (not shown) for providing a vacuum pressure within processing space 14, which is generally necessary for CVD processes. The manifold or showerhead 20 of the invention is illustrated supported around its peripheral edges by supports 21 such that the bottom face surface 22 of the showerhead faces into the processing space 14 toward substrate 18. In a preferred embodiment, showerhead 20 is generally parallel to substrate 18, which is desired for RF parallel plate PECVD processes.

In accordance with the principles of the present invention, separate reactant gases are provided to showerhead 20 by gas delivery system 26 and system 28, respectively. Furthermore, for PECVD processes, showerhead 20 is coupled through an appropriately constructed RF shaft or line 30 to an RF energy source 32 for biasing the showerhead and creating a plasma within processing space 14 for plasma-enhanced deposition of PECVD, as understood by a person of ordinary skill in the art. The embodiments of the invention disclosed herein are configured for two separate reactant gases. However, as will be understood by a person of ordinary skill in the art, the present invention might be utilized for introducing more than two separate reactant gases through showerhead 20.

Figure 2:
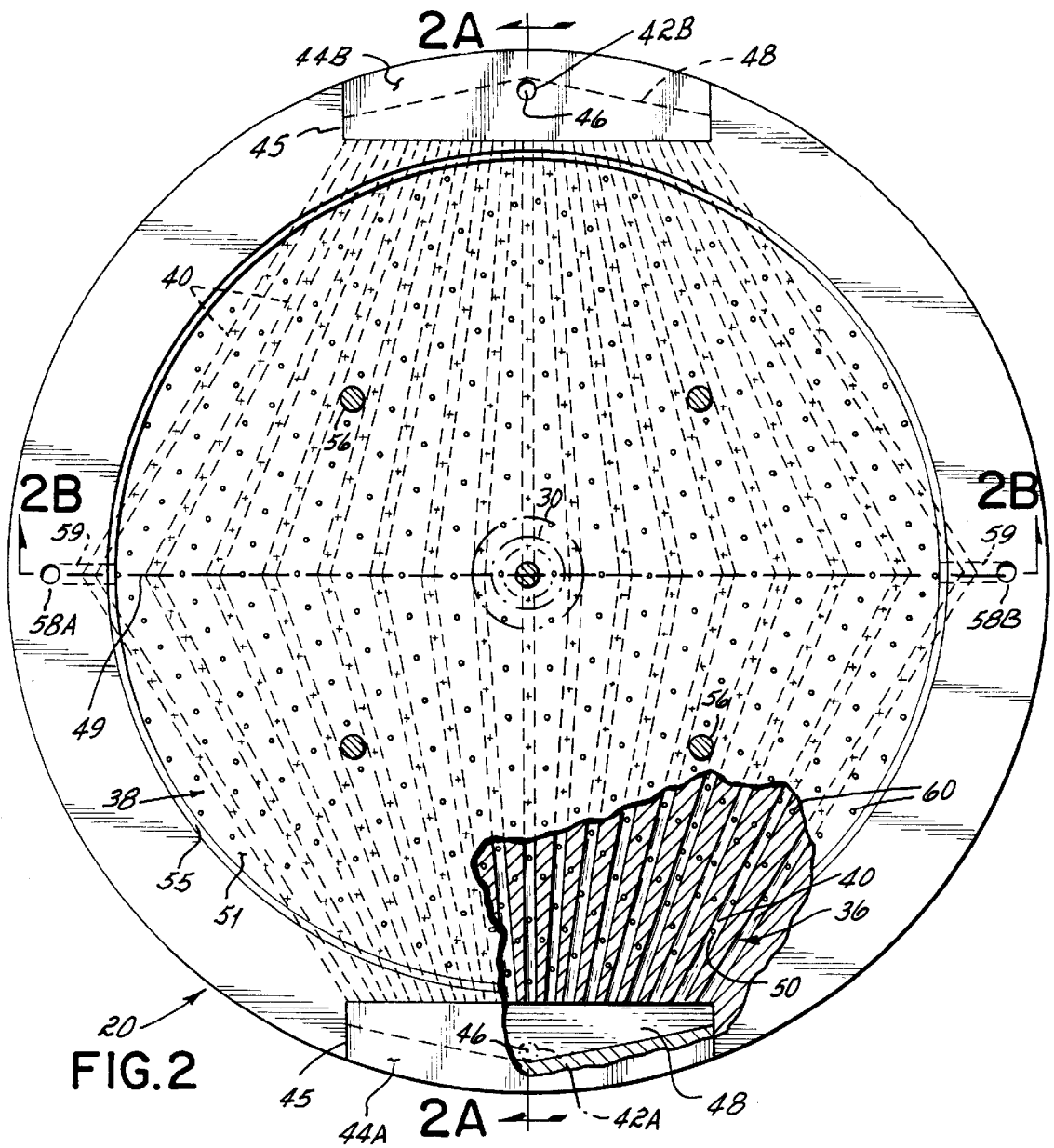
FIG. 2 is a top plan view in partial cross-section, of one embodiment of the present invention taken along lines 2—2 of FIG. 1, with the cover removed for clarity.

FIGS. 2, 2A, and 2B, illustrate plan and sectional views of one embodiment of the showerhead 20 of the invention, illustrating separate reactant gas spaces therein. Showerhead 20 may be formed of stainless steel or other suitable materials, and is preferably conductive to be used in PECVD processes. As illustrated in FIGS. 2A and 2B, showerhead 20 includes a first planar space 36 for containing a first reactant gas, and a second planar space 38, physically isolated from the first gas space 36, so as to provide separation and segregation of the reactant gases until they are dispersed from showerhead 20 in accordance with the principles of the invention. For ease of reference, the first reactant gas injected into first space 36 will be referred to as gas A, while the second reactant gas injected into second space 38 will be referred to as gas B. As will be understood in accordance with the principles of the invention, other embodiments might utilize more than two reactant gases.

The first space 36 comprises a plurality of gas distribution passages 40 which collectively form first space 36. The passages 40 extend from one gas port inlet 42A at a peripheral area of the showerhead to another gas inlet 42B at another peripheral area of the showerhead 20, positioned approximately 180° from the port 42A. In that way, gas is introduced into the passages 40 from both ends thereof. The passages 40 are generally co-planar and span across the showerhead from inlet port 42A to port 42B to define planar first space 36.

Showerhead 20 further includes peripheral coupler pieces or couplers 44A, 44B, which define the respective inlets 42A and 42B. The coupler pieces 44A, 44B, each interface with a respective notch 45 formed in the showerhead 20 and include a main inlet port 46 which branches into a wide outlet port 48. The end of the wide outlet port 48 of each of the couplers communicates with the respective ends of the elongated passages 40, which make up the first space 36. In that way, gas A introduced into port 46 is distributed through ports 48 and simultaneously through the first space passages 40. The couplers direct gas A to each of the ends of the passages 40 so that gas introduced at the periphery of the circular showerhead is distributed uniformly in the first space and around the showerhead.

Referring to FIG. 2, it may be seen that a majority of the elongated passages 40 are formed in showerhead 20 to angle outwardly from one coupler 44A to a diametrical centerline 49 and then back to the other coupler 44B in a similar fashion. In that way, the passages 40 reach a maximum area around the face 22 of showerhead 20 to provide an even and uniform distribution of gas A. The passages 40 are isolated from each other along their lengths, but couple together at the couplers 44A, 44B.

To disperse gas A, showerhead 20 further comprises a plurality of gas dispersing passages 50 which have outlets at the face surface 22 of showerhead 20. Referring to FIGS. 2 and 2A, gas dispersing passages 50 communicate between the first space passages and face 22 surface to direct gas A in the first space to the substrate 18 in processing space 14. The passages 50 are generally perpendicular to the planes of showerhead 20, first space 36 and substrate 18 to direct gas A directly at substrate 18 and thereabove. The passages 50 are arranged in a grid on face surface 22 of showerhead 20 as illustrated in FIGS. 2 and 4A and discussed further hereinbelow.

Figure 3:
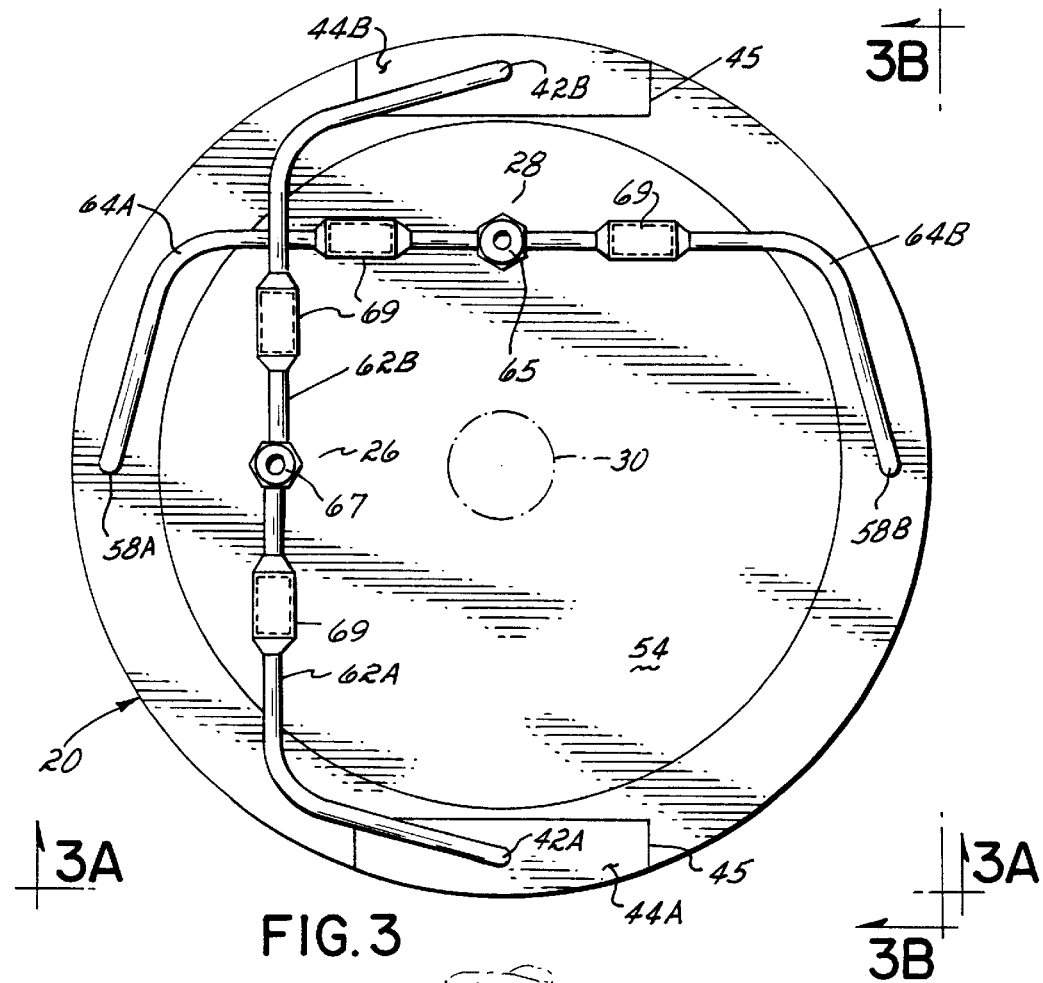
FIG. 3 is the top plan view of an embodiment of the present invention, illustrating coupling of reactant gas lines to the manifold, as seen along line 3—3 of FIG. 1.

Turning now to FIG. 2B, second space 38 is defined between surface 51 above passages 40 and the lower surface 53 of a cover 54. A cylindrical space formed in the showerhead is sealed by a cover 54 (see FIG. 2B) to define a generally cylindrical second space for the gas B to disperse within the showerhead. Cover 54 rests on a circumferential lip 55, and is further held up by a plurality of spacers 56. Gas inlet ports 58A and 58B are formed on opposite sides of showerhead 20 proximate the outer peripheral edge of the showerhead. Referring to FIGS. 2 and 3, it may be seen that gas inlet ports 58A and 58B are generally shifted by approximately 90° around the periphery of the showerhead from ports 42A and 42B. Distribution passages 59 communicate between the ports 58A, 58B, and second space 38. In that way, gas B introduced into the ports is dispersed throughout space 38.

A second plurality of gas-dispersing passages 60 are formed in showerhead 20 and communicate between the second space 38 and showerhead face 22. The passages 60 generally have a greater length than gas A passages 50 since they must travel from second space 38 which is above first space 36 and must open at the bottom face 22 of the showerhead 20 along with passages 50. Gas B passages 60 are positioned in a grid in the showerhead such that none of the passages will intersect the first space elongated passages 40 to prevent mixture of the gases. Referring to FIG. 2C, gas B passages 60 have a first larger diameter D of approximately 0.06 inches, and then narrow to a second, smaller diameter d of approximately 0.018 inches. Therefore gas B, introduced through ports 58A, 58B, is directed into space 38 and then out through the passages 60 into the processing space 14 to mix with gas A above the substrate. As may be seen in FIG. 2, passages 60 are also generally perpendicular to the plane of showerhead 20 and form a grid over the bottom face surface 22 of showerhead 20 which cooperates with the grid formed by openings 50 such that gas A and gas B are dispersed generally uniformly into the processing space 14 over the substrate 18. Since second space 38 is isolated from the first space 36, gas A and gas B are segregated in the showerhead and only mix when dispersed into processing space 14.

Figure 3A:
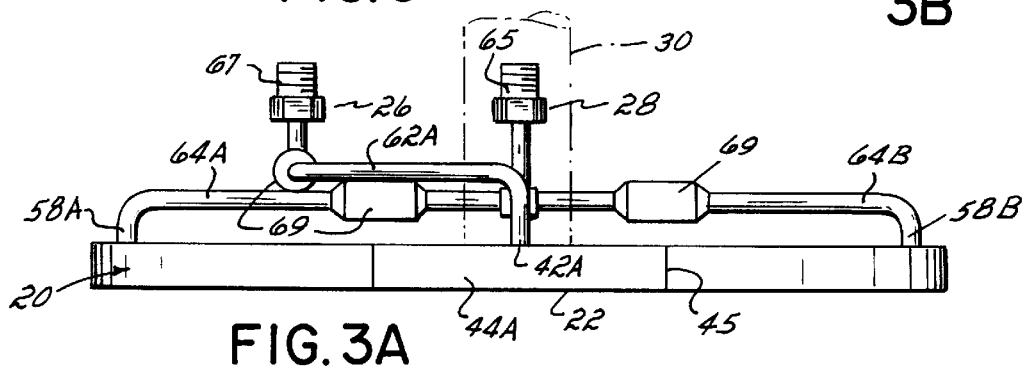
FIG. 3A is a side view taken along lines 3A—3A of FIG. 3.
Figure 3B:
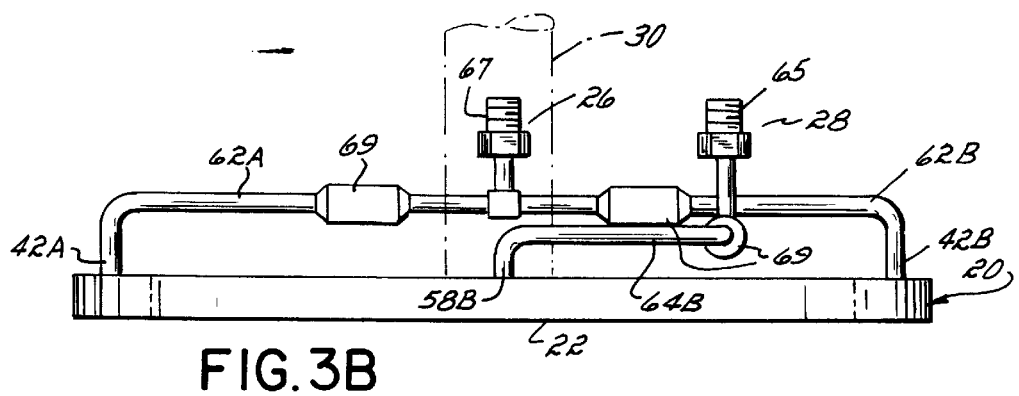
FIG. 3B is a side view taken along lines 3B—3B.

FIGS. 3, 3A, and 3B disclose a plan view, and side views of a first gas delivery system 26 and a second gas delivery system 28 which contain gas A and gas B, respectively, for introduction into showerhead 20. Referring to FIG. 3A, gas system 28 for gas B includes a single inlet 65 which feeds into lines 64A and 64B, which are, in turn, coupled with inlets 58A and 58B, respectively. Referring to FIG. 3B, gas A is similarly introduced and system 26 includes the single inlet port 67 which couples to lines 62A and 62B to deliver gas to the inlets 42A and 42B, respectively. Each of the lines may include one or more filter elements 69 for filtering the reactant gases introduced to the showerhead. Systems 26, 28 are coupled to gas supplies (not shown) through appropriate openings in the reaction chamber depending upon the structure of the chamber.

While the showerhead of the present invention may be utilized in traditional CVD environments, it may also be utilized for PECVD environments utilizing an RF plasma. In the past, dispersing different reactant gases with gas rings did not provide a suitable environment for parallel-plate RF plasma systems. With the present invention, a parallel plate system may be maintained wherein the showerhead 20 is biased with RF energy to form an RF electrode and create an electric field in the processing space 14 to form and sustain an ionized plasma. To that end, the cover 54 of showerhead 20 is coupled to a conductive metal hub or stem 66 which in turn couples with a receiving shoulder 68 when the cover 54 is in position on the showerhead. Stem 66 in turn, is coupled to RF source 32 through an appropriately conductive line 30 such that the showerhead may be biased with RF energy to act as an RF electrode. It has been found that maintaining a biased planar showerhead in close proximity and parallel to a substrate (e.g., one inch spacing) provides a uniformly dense plasma for a PECVD process as discussed in U.S. Pat. No. 5,567,243, which is incorporated herein by reference in its entirety. In that way, a parallel plate RF system may be maintained while keeping the reactant gases segregated until they are introduced above the substrate 18 in space 14. The present invention has thus been found to reduce or eliminate pre-mixing of the reactant gases and deposition upstream of the processing space 14 while maintaining the parallel plate configuration necessary for PECVD.

For one preferred embodiment of the invention, FIG. 4A illustrates a portion of the grid of passages 50 for gas A. Similar quadrants are essentially duplicated on face surface 22. FIG. 4B, on the other hand, illustrates a portion of the grid of passages 60 for introducing gas B also with duplication of the quadrant illustrated in 4B around the remainder of the showerhead.

Table 1 below lists the X-Y coordinates of the various gas A passage openings of one embodiment of the invention, with the origin 0,0 defined from the physical center of the circular showerhead face surface 22. Table 2 illustrates similar X-Y coordinates for the gas B passages. It will be readily understood that different coordinates might also be utilized to form a grid of gas-dispersing openings in the showerhead as will be readily understood by a person of ordinary skill in the art. The openings in the embodiment of FIGS. 2, 4A and 4B, will provide a uniform distribution of the reactant gases in the processing space above substrate 18 for efficient and uniform deposition of gases over the substrate 18.

TABLE 1

| HOLE | Gas A Passage Coordinates | |
|---|---|---|
| | x | y |
| A1 | 0.000 | 0.300 |
| A2 | 0.524 | 0.252 |
| A3 | 1.056 | 0.234 |
| A4 | 1.602 | 0.215 |
| A5 | 2.166 | 0.195 |
| A6 | 2.757 | 0.174 |
| A7 | 3.383 | 0.153 |
| A8 | 4.052 | 0.129 |
| A9 | 0.000 | 0.795 |
| A10 | 0.489 | 0.763 |
| A11 | 0.989 | 0.711 |
| A12 | 1.508 | 0.656 |
| A13 | 2.051 | 0.599 |
| A14 | 2.625 | 0.539 |
| A15 | 3.239 | 0.474 |
| A16 | 3.906 | 0.404 |
| A17 | 0.000 | 1.367 |
| A18 | 0.452 | 1.287 |
| A19 | 0.920 | 1.204 |
| A20 | 1.410 | 1.118 |
| A21 | 1.928 | 1.027 |
| A22 | 2.483 | 0.929 |
| A23 | 3.084 | 0.823 |
| A24 | 3.745 | 0.706 |

TABLE 1-continued

Gas A Passage Coordinates

| HOLE | x | y |
|---|---|---|
| A25 | 0.000 | 1.932 |
| A26 | 0.414 | 1.829 |
| A27 | 0.847 | 1.721 |
| A28 | 1.306 | 1.607 |
| A29 | 1.797 | 1.484 |
| A30 | 2.329 | 1.352 |
| A31 | 2.914 | 1.206 |
| A32 | 3.566 | 1.043 |
| A33 | 4.306 | 0.859 |
| A34 | 0.000 | 2.518 |
| A35 | 0.374 | 2.396 |
| A36 | 0.770 | 2.268 |
| A37 | 1.195 | 2.130 |
| A38 | 1.658 | 1.975 |
| A39 | 2.160 | 1.816 |
| A40 | 2.723 | 1.633 |
| A41 | 3.363 | 1.425 |
| A42 | 4.102 | 1.185 |
| A43 | 0.000 | 3.131 |
| A44 | 0.332 | 2.997 |
| A45 | 0.688 | 2.853 |
| A46 | 1.074 | 2.697 |
| A47 | 1.498 | 2.526 |
| A48 | 1.971 | 2.335 |
| A49 | 2.507 | 2.118 |
| A50 | 3.128 | 1.867 |
| A51 | 3.861 | 1.571 |
| A52 | 0.000 | 3.780 |
| A53 | 0.287 | 3.640 |
| A54 | 0.599 | 3.488 |
| A55 | 0.941 | 3.321 |
| A56 | 1.323 | 3.134 |
| A57 | 1.668 | 3.073 |
| A58 | 1.841 | 2.787 |
| A59 | 2.258 | 2.679 |
| A60 | 2.759 | 2.493 |
| A61 | 2.935 | 2.300 |
| A62 | 3.568 | 2.040 |
| A63 | 0.000 | 4.475 |
| A64 | 0.239 | 4.337 |
| A65 | 0.501 | 4.185 |
| A66 | 0.794 | 4.016 |
| A67 | 1.126 | 3.825 |
| A68 | 1.509 | 3.603 |
| A69 | 1.848 | 3.520 |
| A70 | 2.069 | 3.182 |
| A71 | 2.394 | 3.179 |
| A72 | 2.622 | 2.888 |
| A73 | 3.202 | 2.626 |
| A74 | 1.605 | 4.145 |
| A75 | 2.033 | 3.926 |
| A76 | 2.236 | 3.613 |
| A77 | 2.608 | 3.576 |
| A78 | 2.871 | 3.217 |

TABLE 2

Gas B Passage Coordinates

| HOLE | x | y |
|---|---|---|
| B1 | 0.300 | 0.000 |
| B2 | 0.795 | 0.000 |
| B3 | 1.367 | 0.000 |
| B4 | 1.932 | 0.000 |
| B5 | 2.518 | 0.000 |
| B6 | 3.131 | 0.000 |
| B7 | 3.780 | 0.000 |
| B8 | 4.475 | 0.000 |
| B9 | 0.252 | 0.524 |
| B10 | 0.763 | 0.489 |
| B11 | 1.287 | 0.452 |

TABLE 2-continued

Gas B Passage Coordinates

| HOLE | x | y |
|---|---|---|
| B12 | 1.829 | 0.414 |
| B13 | 2.396 | 0.374 |
| B14 | 2.997 | 0.332 |
| B15 | 3.640 | 0.287 |
| B16 | 4.337 | 0.239 |
| B17 | 0.234 | 1.056 |
| B18 | 0.711 | 0.989 |
| B19 | 1.204 | 0.920 |
| B20 | 1.721 | 0.847 |
| B21 | 2.268 | 0.770 |
| B22 | 2.853 | 0.688 |
| B23 | 3.488 | 0.599 |
| B24 | 4.185 | 0.501 |
| B25 | 0.215 | 1.602 |
| B26 | 0.656 | 1.508 |
| B27 | 1.118 | 1.410 |
| B28 | 1.607 | 1.306 |
| B29 | 2.130 | 1.195 |
| B30 | 2.697 | 1.074 |
| B31 | 3.321 | 0.941 |
| B32 | 4.016 | 0.794 |
| B33 | 0.195 | 2.166 |
| B34 | 0.599 | 2.051 |
| B35 | 1.027 | 1.928 |
| B36 | 1.484 | 1.797 |
| B37 | 1.975 | 1.658 |
| B38 | 2.526 | 1.498 |
| B39 | 3.134 | 1.323 |
| B40 | 3.825 | 1.126 |
| B41 | 0.174 | 2.757 |
| B42 | 0.539 | 2.625 |
| B43 | 0.929 | 2.483 |
| B44 | 1.352 | 2.329 |
| B45 | 1.816 | 2.160 |
| B46 | 2.335 | 1.971 |
| B47 | 2.787 | 1.841 |
| B48 | 3.073 | 1.668 |
| B49 | 3.603 | 1.509 |
| B50 | 0.153 | 3.383 |
| B51 | 0.474 | 3.239 |
| B52 | 0.823 | 3.084 |
| B53 | 1.206 | 2.914 |
| B54 | 1.633 | 2.723 |
| B55 | 2.118 | 2.507 |
| B56 | 2.679 | 2.258 |
| B57 | 3.182 | 2.069 |
| B58 | 3.520 | 1.848 |
| B59 | 4.145 | 1.605 |
| B60 | 0.129 | 4.052 |
| 861 | 0.404 | 3.906 |
| B62 | 0.706 | 3.745 |
| B63 | 1.043 | 3.566 |
| B64 | 1.425 | 3.363 |
| B65 | 1.867 | 3.128 |
| B66 | 2.300 | 2.935 |
| B67 | 2.493 | 2.759 |
| B68 | 2.888 | 2.622 |
| B69 | 3.179 | 2.394 |
| B70 | 3.613 | 2.236 |
| B71 | 3.926 | 2.033 |
| B72 | 0.859 | 4.306 |
| B73 | 1.185 | 4.102 |
| B74 | 1.571 | 3.861 |
| B75 | 2.040 | 3.568 |
| B76 | 2.626 | 3.202 |
| B77 | 3.217 | 2.871 |
| B78 | 3.576 | 2.608 |

Figure 5:
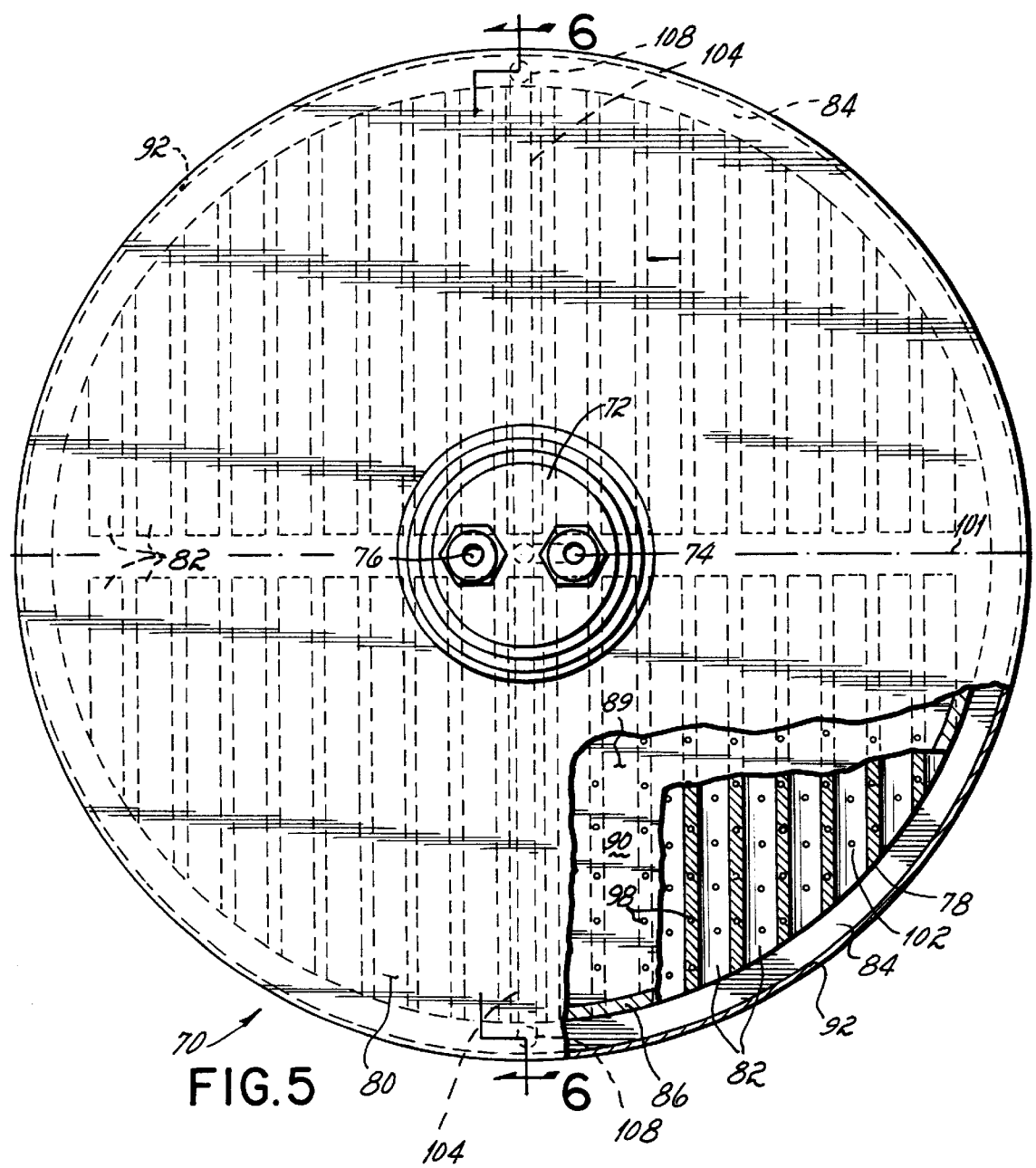
FIG. 5 illustrates a top plan view, and partial cross section, of an alternative embodiment of the showerhead of the present invention.

FIGS. 5–8B illustrate an alternative embodiment of the present invention wherein the reactant gases are introduced into the center of the showerhead rather than at the periphery thereof. Referring to FIG. 5, showerhead 70 includes a center hub or stem 72 having a gas A inlet port 74 and a gas B inlet port 76. Showerhead 70 is generally planar and has a circular cross section similar to the showerhead 20 previously described. Stem 72 extends generally perpendicular to the plane of showerhead 70 (see FIG. 6).

Referring now to FIG. 6, showerhead 70 comprises a lower body section 78 which interacts with a cover section 80 which rests on the body section 78. The body section 78 is formed with a plurality of gas distribution fingers 82 as discussed further hereinbelow. Body section 78 also forms part of a peripheral channel 84. Cover section 80 includes an annular rim 86 which rests on an annular surface 87 of body section 78. Rim 86 provides a stand-off above top surface 89 of the bottom section so that body section 78 and cover section 80 cooperate to define a second space 90 for distribution of gas B. Cover section 80 also forms part of the peripheral channel 84. A metal band 92 extends around the periphery of showerhead 70 and is attached to the cover section 80 and body section 78 such as by welding, to enclose channel 84. Channel 84 is utilized to distribute and disperse gas A as further described hereinbelow.

Gas B is introduced into second space 90 through port 76. Port 76 terminates in a shunt or cap structure 94 which includes a plurality of openings 96 to distribute gas B in space 90. Gas B is directed through port 76 generally perpendicular to the plane of space 90. However, the cap 94 directs the gas in a direction generally parallel with space 90 to provide uniform distribution around space 90 and uniform dispersal of gas B. Gas B is dispersed through a plurality of gas-dispersing passages 98 which are formed in the showerhead body section 78 and communicate between a lower face surface 99 of the showerhead 70 and gas B space 90. Similar to the gas B passages of the previously described embodiment, the passages 98 have a first diameter $D_1$ of approximately 0.06 inches, and then narrow down to the second diameter $d_1$ of approximately 0.018 inches to direct the gas out of space 90 at the face surface 99.

Turning now to FIGS. 5 and 7, the first space comprises a plurality of gas distribution passages, such as gas distribution fingers 82 which disperse gas A throughout the showerhead for even, uniform distribution thereof. Referring to FIG. 5, one set of gas distribution fingers 82 extends from peripheral channel 84 to approximately one side of a diametrical line 101, while another set of fingers extends from the peripheral channel on the other side of the showerhead 70 to proximate the other side of the diametrical line 101. In that way, one set of gas distribution fingers directs gas to one side of the showerhead and another set of fingers directs gas to the other side of the showerhead. Gas distribution fingers are each open at one end into the peripheral channel 84 for receiving gas A therefrom. The fingers are co-planar and extend generally parallel to each other and have varying lengths depending upon where they open into the peripheral channel, as clearly illustrated in FIG. 5. The fingers 82 are elongated with a cylindrical shape, and are shown having a circular cross section, although various other shapes of cross-sections might also be utilized.

Gas A is directed from inlet 74, which is plugged at its lower end by a plug 75, to channel 84 via a diametrical bore 104 in cover section 80 plugged at each end by plugs 106. The bore 104, at each end, feeds peripheral channel 84 through axial ports 108. In this way, the channel 84 receives gas A at two places 180° apart and from the channel gas A is directed into the distribution fingers 82 and to the passages 102. A second set of gas-dispersing passages 102 communicates between the gas distribution fingers 82 and the face surface 99 of the showerhead 70 to disperse gas A. As illustrated in FIG. 7, the gas dispersing passages 98, which communicate with gas B space 90, extend through the showerhead body section 78 without intersecting fingers 82. In that way, the reactant gases are not mixed within the showerhead in accordance with the principles of the present invention. Passages 102 have a diameter of approximately 0.018 inches.

Referring to FIGS. 8A and 8B, various locations of the openings for the gas dispersing passages are shown referenced to one quadrant of the showerhead. The respective grids are formed by duplication of the quadrants illustrated in FIGS. 8A and 8B. FIG. 8A illustrates the location of gas A openings 102 which communicate with the gas distribution fingers 82. FIG. 8B, on the other hand, illustrates the gas dispersing openings 98 which communicate with the gas B space 90. On showerhead 70, the gas dispersing openings are arranged in equally spaced rows and columns, as opposed to the openings in the previously disclosed embodiment of showerhead 20.

Figure 9:
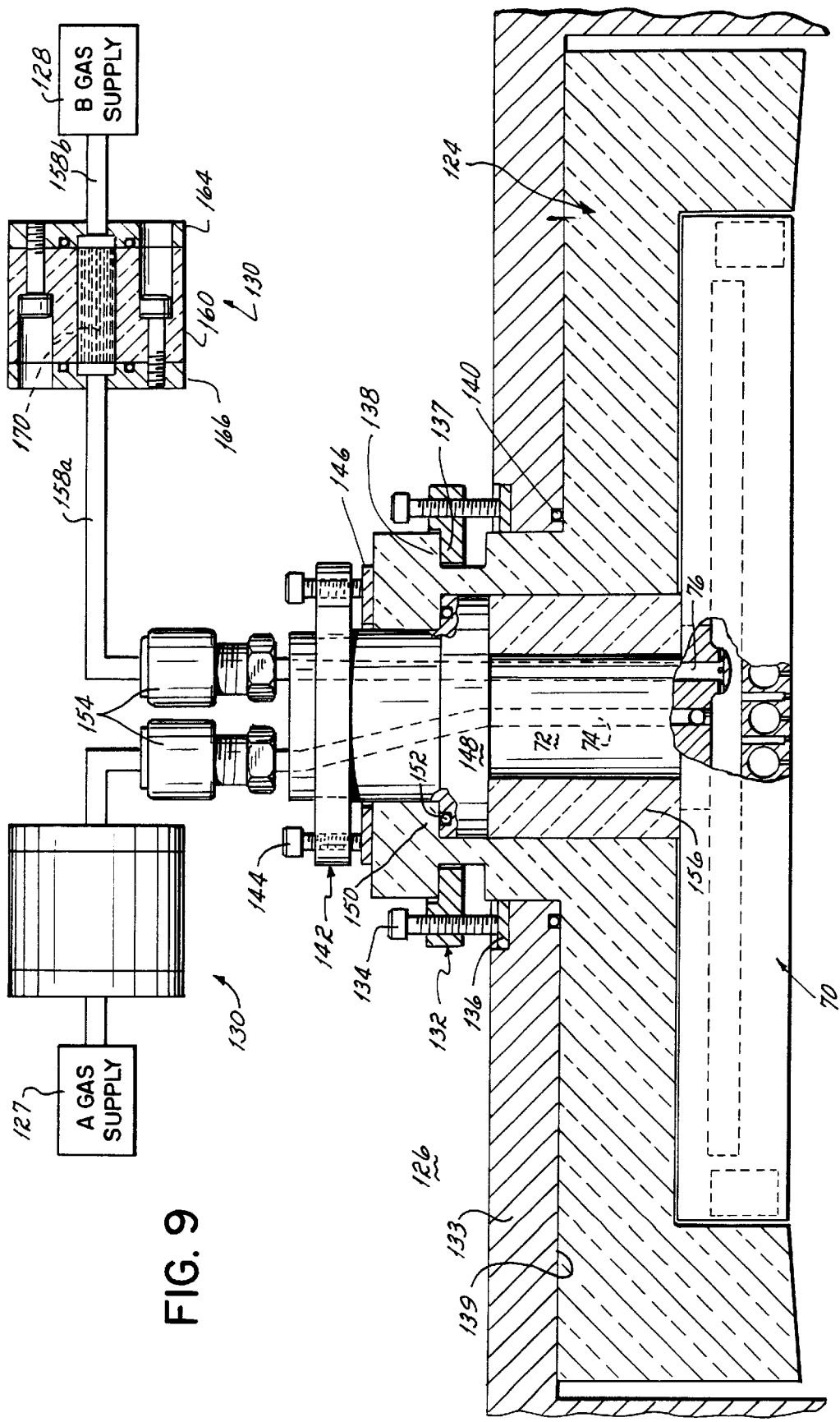
FIG. 9 is a partial cross-sectional view illustrating the showerhead mounted in a reaction chamber.

FIG. 9 illustrates another feature of the present invention wherein a showerhead as illustrated in FIGS. 5–8B is mounted for use within a CVD reaction chamber. Showerhead 70 is surrounded by a ceramic shield 124 formed with a suitable ceramic, such as alumina. Stem 72 supports the showerhead 70 within the reaction chamber 126 and also provides electrical connections as discussed further hereinabove. The showerhead is appropriately coupled to a gas A supply 127 and a gas B supply 128. To suppress plasma discharge within the gas lines leading to the showerhead, the showerhead 70 is coupled to the appropriate gas supplies through plasma suppressors 130. Plasma suppressor 130 is shown coupled in line between the gas B supply 128 and the showerhead 70. In accordance with the principles of the present invention, a similar suppressor (not shown) will be utilized between the gas A supply 127 and the showerhead 70. Ceramic shield 124 is supported in reaction chamber 126 by a support ring 132 which is suspended about the metal lid 133 of reaction chamber 126 by appropriate bolts 134. The bolts are tightened in a downward direction, and threaded holes formed in the support ring 132 and bear against a washer 136 coupled to metal lid 133 to lift the support ring 132 in a vertically upward direction. A shoulder 137 of support ring 132 bears against an appropriately formed shoulder 138 of the ceramic shield 124 to thus lift the ceramic shield against the inner surface 139 of metal lid 133. A seal 140 is coupled between the upper surface of the ceramic shield 124 and lid surface 139 to provide for a seal where a portion of the shield 124 and stem 72 pass through an opening in lid 133.

A clamp ring 142 engages an upper portion of stem 72 for lifting the stem 72 with respect to ceramic shield 124. As illustrated in FIG. 9, the clamp ring includes a plurality of screws or bolts 144 therearound which bear against a metal washer 146 positioned on the upper surface of shield 124. When the bolts 144 are tightened down in appropriately threaded openings of clamp ring 142, they drive the clamp ring 142 vertically upward, and thus pull the stem 72 upward with respect to shield 124. Stem 72 includes a flange 148 which engages an inside shoulder 150 of shield 124. A seal 152 is positioned between flange 148 and shoulder 150 for proper sealing between the stem 72 and shield 124. In that way, support ring 132 lifts shield 124 for sealing and clamp ring 142 lifts stem 72 for sealing. Therefore, the inner environment of reaction chamber 126 is sealed against the outer environment as is necessary in CVD processes. The gas passages 74 and 76 are coupled to the appropriate gas supplies by VCR fittings 154 which are commercially available and well known in the art. As illustrated in FIG. 9, a quartz spacer cylinder 156 is positioned between shield 124 and stem 72 proximate showerhead 70 to suppress secondary plasmas.

Turning now to the plasma suppressors 130, the suppressors provide a generally nonconductive ceramic material between gas line section 158a which is directed to the showerhead 70 and gas line section 158b, which is directed to the appropriate gas supply, such as gas B supply 128. The suppressor 130 includes a ceramic, cylindrically formed body 160 which is preferably also formed of alumina. The respective gas line sections 158a and 158b are coupled to body 160 by nickel end plates 164, 166 which couple the gas line sections 158a, 158b to body 160. A plurality of small parallel channels or passages 170 are formed in body 160 to align and connect with the respective line sections 158a, 158b. The passages are preferably dimensioned to allow the passage of gas to the showerhead 70, but are small enough to prevent the creation of a plasma discharge therein. Accordingly, any plasma discharge from chamber 126 is suppressed to prevent any discharge to the right of suppressor 130, as illustrated in FIG. 9. In one embodiment, the passages are cylindrical, having a diameter of approximately 0.050 inches. In that way, plasma discharge is generally prevented from existing within the gas lines past the suppressor 130.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A method for dispersing a plurality of reactant gases into a processing space of a reaction chamber, the method comprising:

delivering a first gas into a first gas space of a generally planar showerhead located in a reaction chamber, the showerhead having a face surface;

delivering a second gas into a second gas space of said showerhead, the second space being physically isolated from the first space within the showerhead;

spreading the second gas over a generally planar second gas space which is open over a majority of the showerhead face surface for distributing the second gas over a majority of the face surface, and dispersing the second gas through gas-dispersing passages positioned over the face surface and coupled to the second gas space;

directing the first gas into a peripheral area of the first gas space and into a plurality of elongated gas distribution passages extending from the peripheral area and through the showerhead generally side-by-side with adjacent passages, and dispersing the first gas through gas-dispersing passages positioned over the face surface and coupled to the elongated gas distribution passages;

maintaining said first and second gases segregated from one another in the first and second spaces of the showerhead;

whereby the gases are dispersed to react in the processing space and are generally prevented from reacting before they enter the processing space.

2. The method of claim 1 wherein said gas-dispersing passages are positioned spaced along each elongated passage for uniformly dispersing a first gas from the showerhead.

3. The method of claim 1 further comprising directing the first gas to the peripheral area through a single inlet port.

4. The method of claim 1 further comprising directing the first gas into a peripheral area including a peripheral channel in the showerhead for distributing the first gas around the periphery of the showerhead.

5. The method of claim 1 further comprising directing the first gas into a plurality of gas distribution fingers extending in the showerhead from the peripheral channel for distributing the first gas around the showerhead.

6. The method of claim 1 further comprising biasing the showerhead with RF energy to form a plasma from one of said first and second gases.

7. The method of claim 1 wherein said peripheral area is common to all of the elongated gas distribution passages.

8. The method of claim 1 wherein said first and second gas spaces are oriented in a stacked formation in the showerhead.

9. The method of claim 1 wherein said first gas space distribution passages are generally horizontally co-planar.

10. The method of claim 1 wherein said generally planar second gas space is generally unitary within a generally horizontal plane.

11. The method of claim 1 wherein each of said elongated gas distribution passages extends from a side of the showerhead to an opposite side of the showerhead to uniformly distribute the first gas.

* * * * *